United States Patent
Ting

(10) Patent No.: US 9,406,589 B2
(45) Date of Patent: Aug. 2, 2016

(54) VIA CORNER ENGINEERING IN TRENCH-FIRST DUAL DAMASCENE PROCESS

(71) Applicant: Taiwan Semiconductor Manufacturing Company, Ltd., Hsin-Chu (TW)

(72) Inventor: Chih-Yuan Ting, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/213,329

(22) Filed: Mar. 14, 2014

(65) Prior Publication Data

US 2015/0262912 A1     Sep. 17, 2015

(51) Int. Cl.
*H01L 21/4763*     (2006.01)
*H01L 23/48*     (2006.01)
*H01L 21/768*     (2006.01)

(52) U.S. Cl.
CPC ........ *H01L 23/481* (2013.01); *H01L 21/76802* (2013.01); *H01L 21/76877* (2013.01)

(58) Field of Classification Search
CPC ................... H01L 23/481; H01L 21/76802
USPC ........................... 438/622, 637, 638
See application file for complete search history.

(56) References Cited

U.S. PATENT DOCUMENTS

| | | | |
|---|---|---|---|
| 2005/0079701 A1 | 4/2005 | Baks et al. | |
| 2005/0255687 A1* | 11/2005 | Jiang et al. | 438/622 |
| 2006/0148245 A1* | 7/2006 | Kim | 438/640 |
| 2007/0228571 A1 | 10/2007 | Yu et al. | |
| 2008/0119040 A1 | 5/2008 | Lin et al. | |

FOREIGN PATENT DOCUMENTS

| | | |
|---|---|---|
| TW | I305945 B | 2/2009 |
| TW | I309448 B | 5/2009 |
| TW | I315092 B | 9/2009 |
| TW | I330878 B | 9/2010 |
| TW | I331789 B | 10/2010 |
| TW | I335053 B | 12/2010 |
| TW | I338934 B | 3/2011 |

* cited by examiner

*Primary Examiner* — Bradley K Smith
(74) *Attorney, Agent, or Firm* — Slater Matsil, LLP

(57) ABSTRACT

An integrated circuit structure includes a first dielectric layer, an etch stop layer over the first dielectric layer, and a second dielectric layer over the etch stop layer. A via is disposed in the first dielectric layer and the etch stop layer. A metal line is disposed in the second dielectric layer, wherein the metal line is connected to the via. The etch stop layer includes a first portion having an edge contacting an edge of the via, wherein the first portion has a first chemical composition, and a second portion in contact with the first portion. The second portion is spaced apart from the via by the first portion, and wherein the second portion has a second chemical composition different from the first composition.

19 Claims, 10 Drawing Sheets

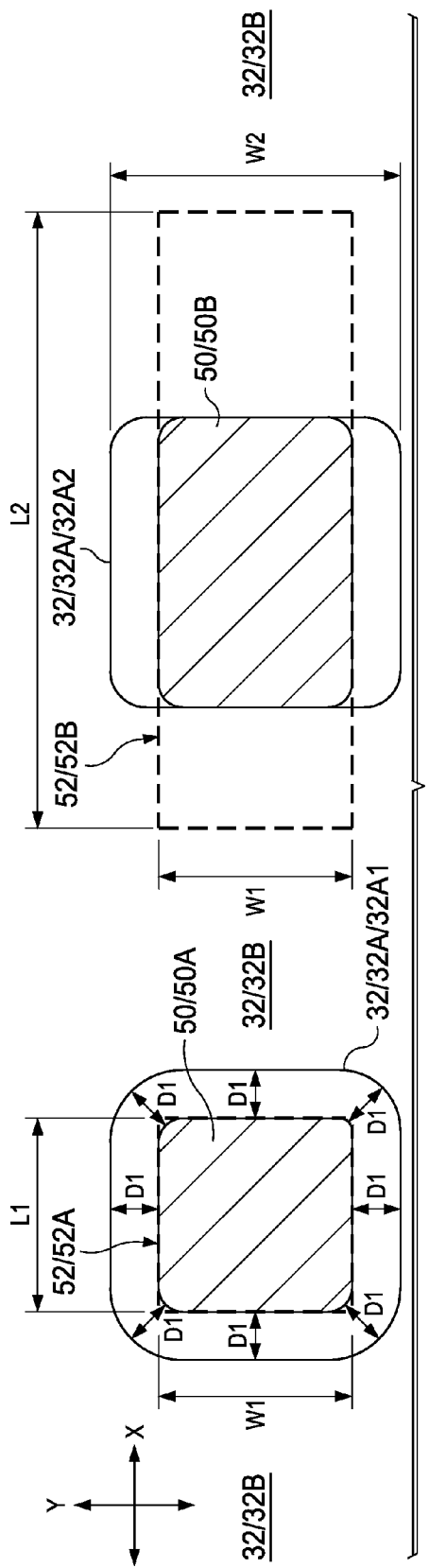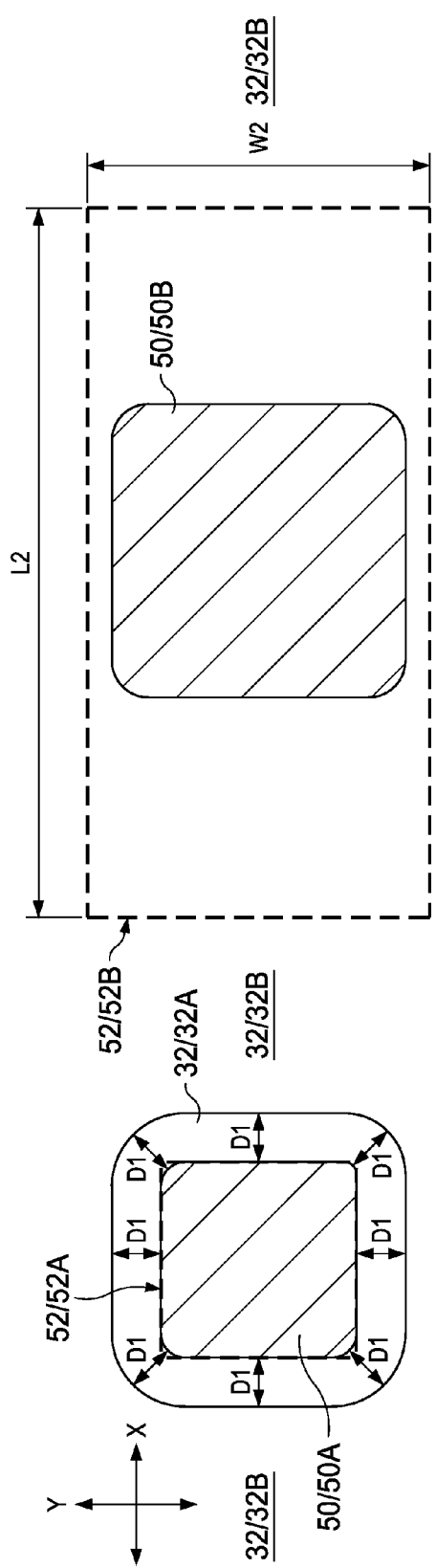

VIA CORNER ENGINEERING IN TRENCH-FIRST DUAL DAMASCENE PROCESS

BACKGROUND

Integrated circuit devices such as transistors are formed over semiconductor wafers. The devices are interconnected through metal lines and vias to form functional circuits. The metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias, a low-k dielectric layer is etched to form trenches and via openings. The etching of the low-k dielectric material may involve forming a hard mask and a dielectric hard mask layer over the low-k dielectric material, and using the patterned hard mask as an etching mask to form trenches. Via openings are also formed and self-aligned to the trench. The trenches and the via openings are then filled with a metallic material, which may comprise copper. A Chemical Mechanical Polish (CMP) is then performed to remove excess portions of the metallic material over the low-k dielectric material.

In the trench-first approach in the formation of the trenches and via openings, the patterns of the trenches are first defined in a hard mask layer, which is formed over a low-k dielectric layer. Via openings are then formed in the low-k dielectric layer. The vias openings stop at an intermediate level of the low-k dielectric layer. Next, the low-k dielectric layer is etched using the patterned hard mask layer as an etching mask, so that trenches and via openings extend down simultaneously, until the via openings reach the bottom of low-k dielectric layer. At this time, the bottoms of the trenches are at an intermediate level between the top surface and the bottom surface of the low-k dielectric layer. The trenches and the via openings are then filled with a conductive material to form metal lines and vias, respectively.

In the interconnect structures formed using the trench-first approach, the vias under the large trenches are significantly wider than the vias under small trenches. This may cause the leakage or dielectric breakdown issues.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method of forming metal lines and vias using trench-first scheme is provided in accordance with various embodiments. The intermediate stages of forming the metal lines and vias are illustrated in accordance with some exemplary embodiments. The variations of the embodiments are discussed. Throughout the various views and illustrative embodiments, like reference numbers are used to designate like elements.

Figure 1:
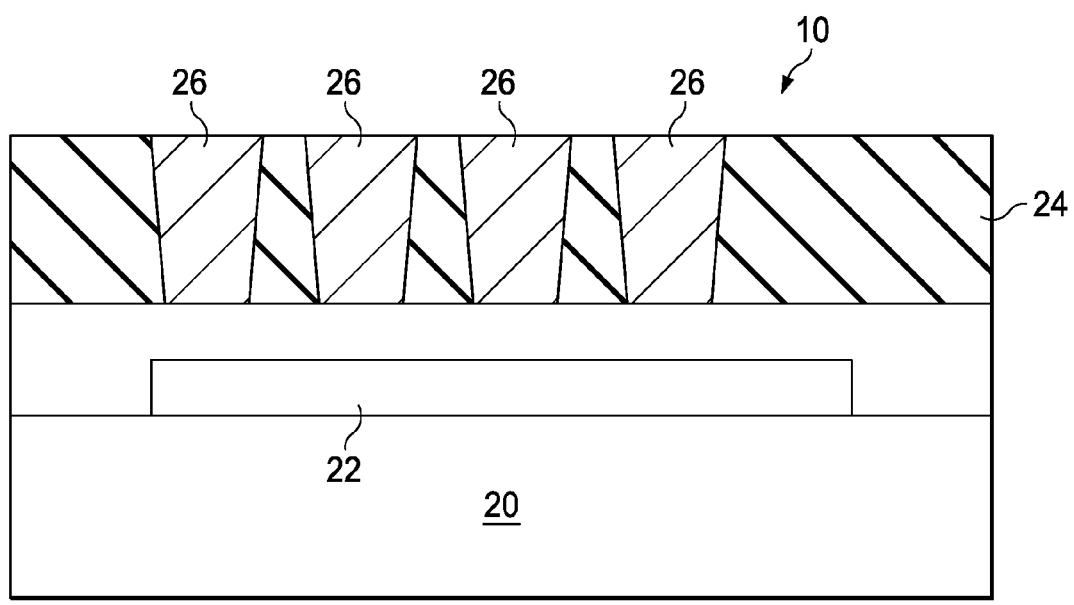
FIGS. 1 through 9 are cross-sectional views of intermediate stages in the formation of metal lines and vias in a low-k dielectric layer in accordance with some exemplary embodiments.

Referring to FIG. 1, wafer 10, which includes substrate 20 and overlying layers, is provided. Substrate 20 may be formed of a semiconductor material such as silicon, silicon germanium, a III-V compound semiconductor, or the like. Substrate 20 may be a bulk substrate or a Semiconductor-On-Insulator (SOI) substrate. Integrated circuit devices 22, which may include active devices such as transistors, are formed at a surface of substrate 20.

Dielectric layer 24 is formed over substrate 20. In some embodiments, dielectric layer 24 is an Inter-Metal Dielectric (IMD), which is a low-k dielectric layer having a dielectric constant (k value) lower than about 3.0, or lower than about 2.5 in some exemplary embodiments. Dielectric layer 24 may include a porous low-k dielectric material such as porous oxygen-doped silicon carbide (SiOC).

Metal features 26 are formed in dielectric layer 24. In some embodiments, metal features 26 are metal lines, which may be formed of copper or a copper alloy, although it may also comprise other conductive materials such as tungsten, aluminum, or the like.

Figure 2:
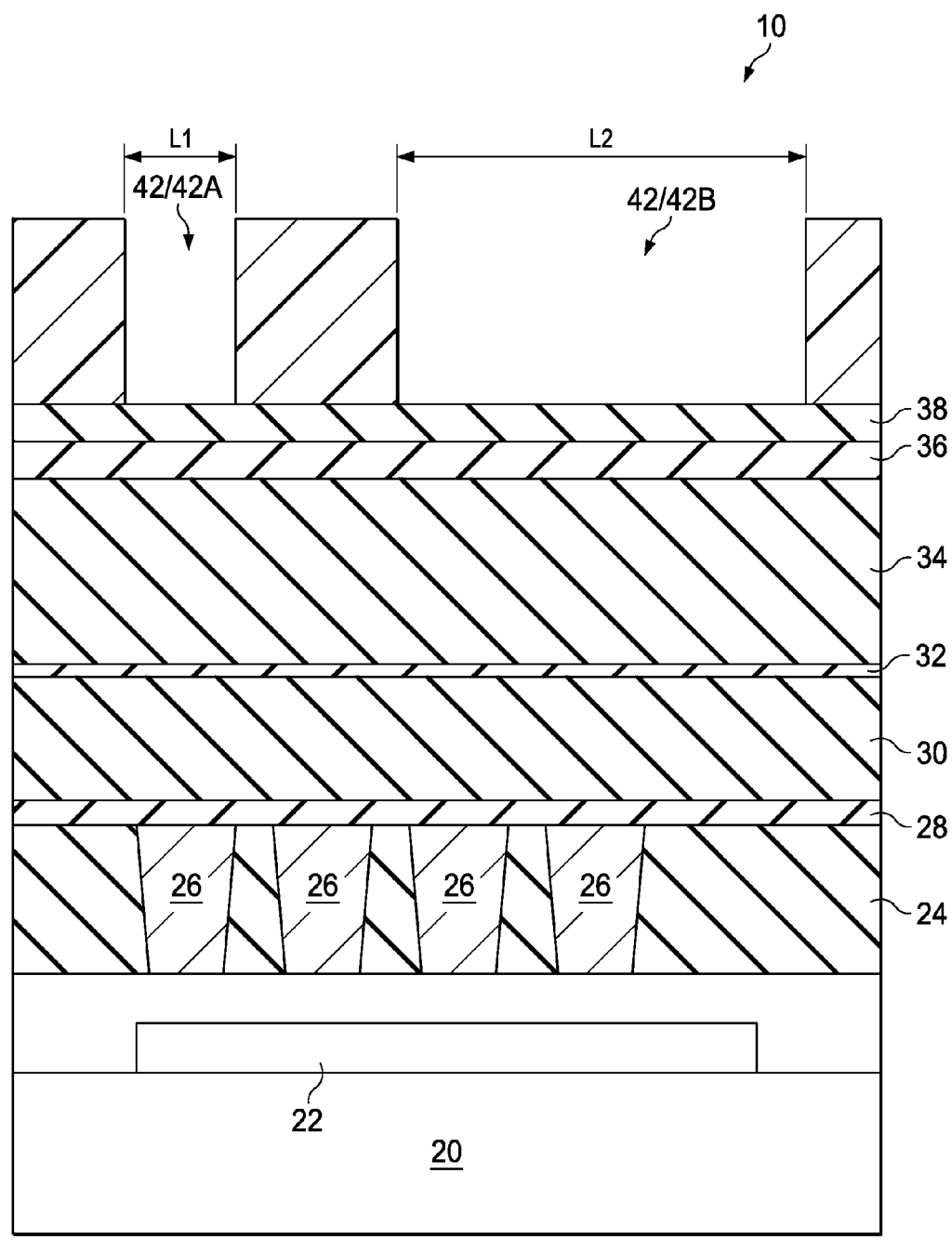

Referring to FIG. 2, etch stop layer 28 is formed over dielectric layer 24 and metal features 26. Etch stop layer 28 may comprise a dielectric material such as silicon carbide, silicon nitride, silicon oxynitride, or the like. Dielectric layers 30, 32, and 34 are further formed over etch stop layer 28.

Dielectric layers 30 and 34 may comprise a low-k dielectric material with a dielectric constant (k value) lower than about 3.5, lower than about 3.0, or lower than about 2.5, for example. Dielectric layers 30 and 34 may include porous low-k dielectric materials such as SiOC, carbon-doped silicon oxide, fluorine-doped silicon oxide, organic low-k materials, or the like. Accordingly, throughout the description, dielectric layers 30 and 34 are alternatively referred to as low-k dielectric layers 30 and 34, respectively. The formation methods of dielectric layers 30 and 34 include spin on, Chemical Vapor Deposition (CVD), Plasma Enhanced CVD (PECVD), Low Pressure CVD (LPCVD), and other applicable deposition techniques.

Dielectric etch stop layer 32 is formed between low-k dielectric layers 30 and 34. In accordance with some embodiments, etch stop layer 32 comprises a metal and an additional element or elements. The metal may be selected from aluminum, manganese, cobalt, titanium, tantalum, tungsten, nickel, tin, magnesium, or combinations thereof. The additional element(s) may comprise oxygen, nitrogen, or both oxygen and nitrogen. In some embodiments, the material for forming etch stop layer 32 is expressed as $M_xO_yN_z$, wherein M represents the metal, and values x, y, and z are the atomic percentages of the metal, oxygen, and nitrogen, respectively. Value x may be smaller than about 0.5 to ensure that etch stop layer 32 is a dielectric layer. Value x may also be greater than about 50 percent, for example, as high as about 0.7, providing etch stop layer 32 remains to be a dielectric layer. In some exemplary embodiments, atomic percentage x is between about 0.2 and 0.5, atomic percentage y is between about 0 and about 0.8, and atomic percentage z is between about 0 and about 0.8. One, but not both, of atomic percentages y and z may also be zero. In which case, dielectric etch stop layer 32 is a metal oxide layer or a metal nitride layer.

Etch stop layer 32 may be formed using Atomic Layer Deposition (ALD), Chemical Vapor Deposition (CVD), Physical Vapor Deposition (PVD), coating, or other applicable deposition methods. The thickness of etch stop layer 32 is small in order to reduce its adverse effect on the parasitic capacitance of the resulting metal lines and vias. In some exemplary embodiments, the thickness of etch stop layer 32 is between about 5 angstrom and about 50 angstrom. It is appreciated, however, that the values recited throughout the description are merely examples, and may be changed to different values. Etch stop layer 32 may be in physical contact with the underlying low-k dielectric layer 30 and the overlying low-k dielectric layer 34.

FIG. 2 also illustrates the formation of hard mask 36 over low-k dielectric layer 34, hard mask layer 38 over hard mask 36, and photo resist 40 over hard mask 38. Hard mask 36 may comprise a carbon and/or nitrogen based material such as CN, SiCN, SiCO, SiC, or the like. Hard mask 36 may be formed by a deposition method such as CVD or PVD. Other deposition methods such as ALD may also be used.

Hard mask 38 is formed over hard mask 36. Hard mask 38 may include a metal-containing material such as Ti, TiN, Ta, TaN, Al, or the like. Accordingly, hard mask 38 is alternatively referred to as a metal hard mask. In alternative embodiments, hard mask 38 is formed of a non-metal-containing material such as $SiO_2$, SiC, SiN, SiON, or the like. The materials of hard mask 36 and hard mask 38 are different from each other, so that there is a high etching selectivity in the subsequent etch of low-k dielectric layers 30 and 34 and etch stop layer 32.

Further referring to FIG. 2, photo resist 40 is applied and patterned, so that trenches 42 are formed in photo resist 40. Trenches 42 include trench 42A, which has lateral dimension (such as length) L1, and trench 42B having length L2. The widths (not shown, referring to widths W1 and W2 in FIGS. 8B and 8C) of trenches 42A and 42B may be equal to each other or different from each other. In some embodiments, ratio L1/L2 is greater than about 2, greater than about 4, or may be any value greater than 4. Length L1 may be equal to or greater than the minimum width that can be formed by the lithography technology that is used for forming trenches 42 in some embodiments.

Figure 3:
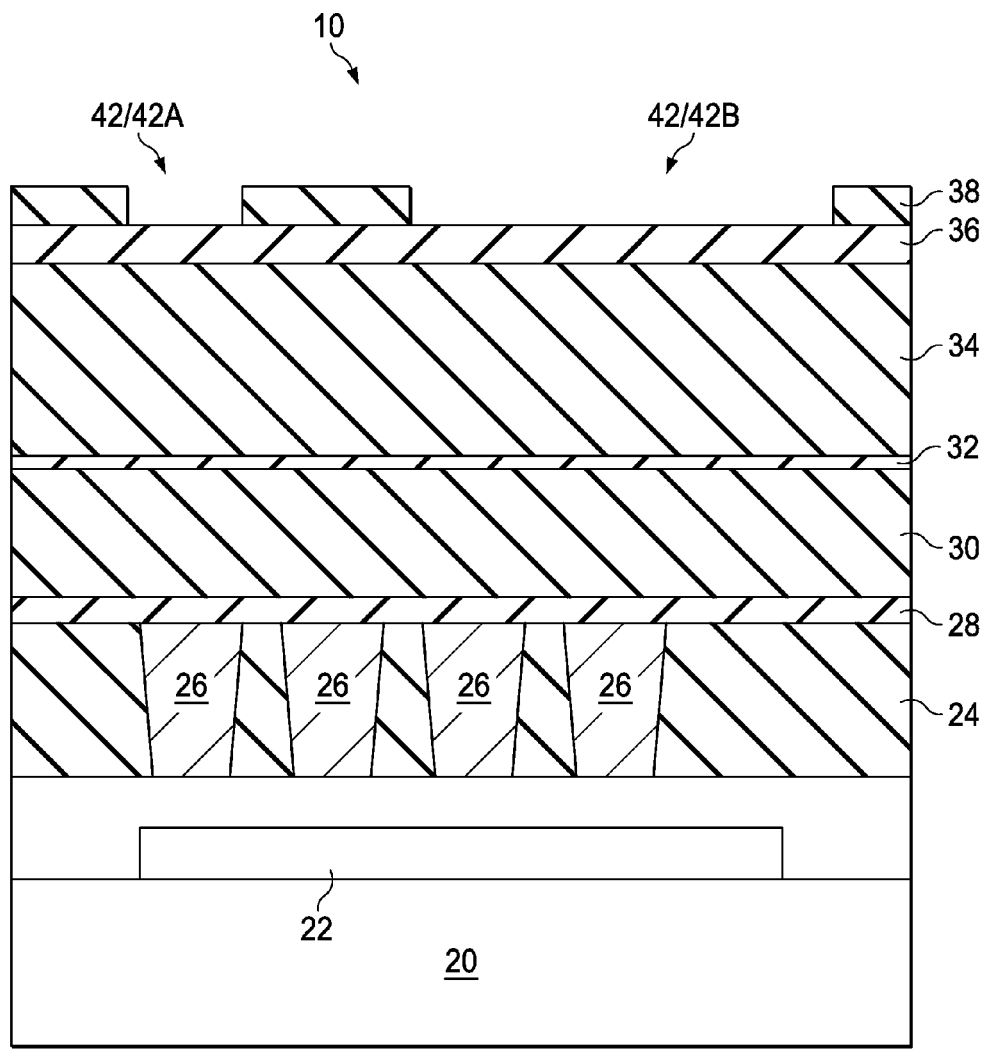

Referring to FIG. 3, hard mask 38 is etched using photo resist 40 (FIG. 2) as an etching mask, so that trenches 42 extend into hard mask 38. Hard mask 36 is used as an etch stop layer in the etching of hard mask 38. Photo resist 40 is then removed.

Figure 4:
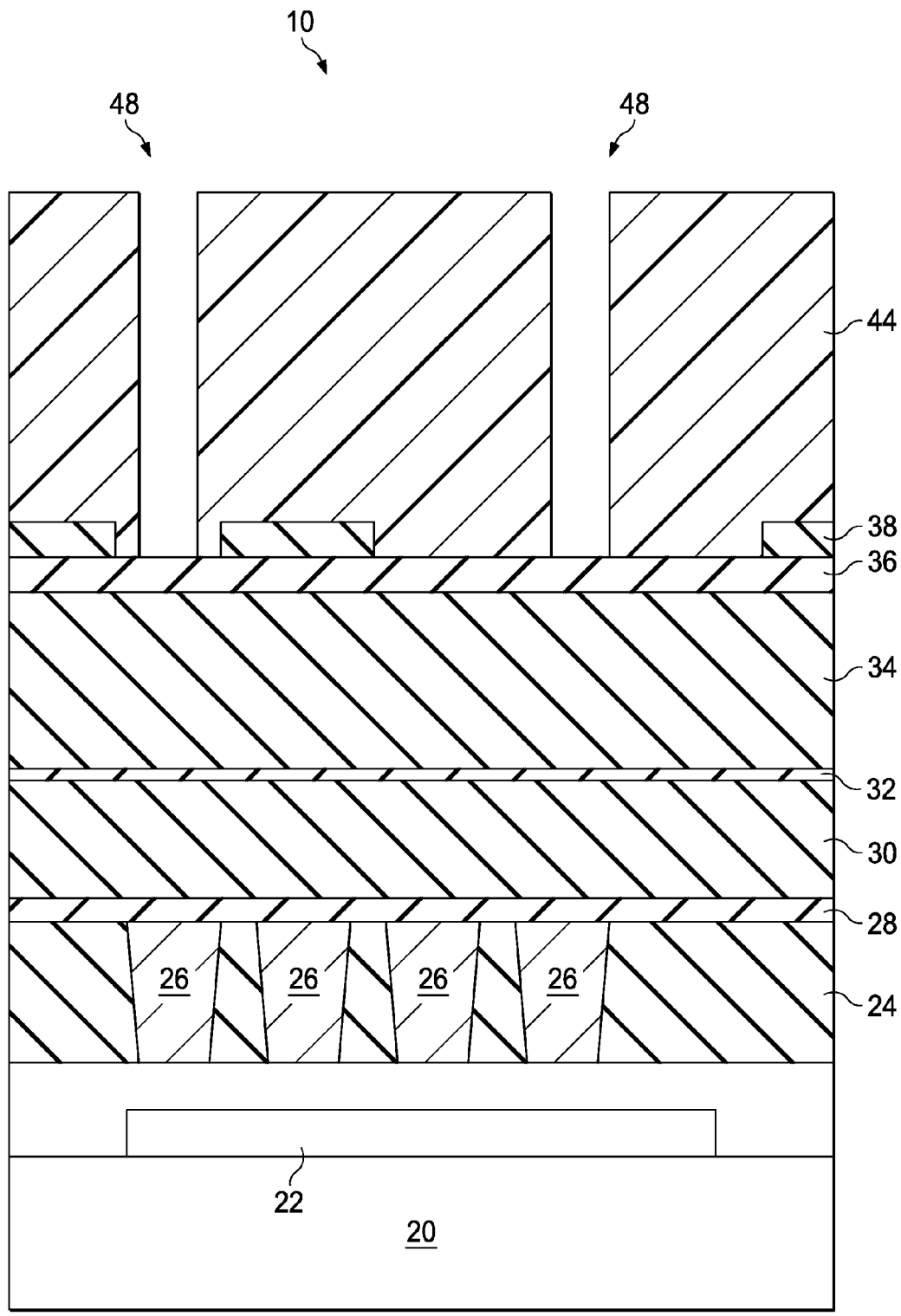

FIG. 4 illustrates the application and the patterning of photo resist 44, in which openings 48 are formed. Openings 48 are used for forming via openings in dielectric layers 30 and 32. Hence, the positions of openings 48 are designed to be at the positions of the corresponding vias. Openings 48 may have shapes and sizes the same as each other. Furthermore, openings 48 extend into trenches 42 (FIG. 3) in hard mask 38.

Figure 5:
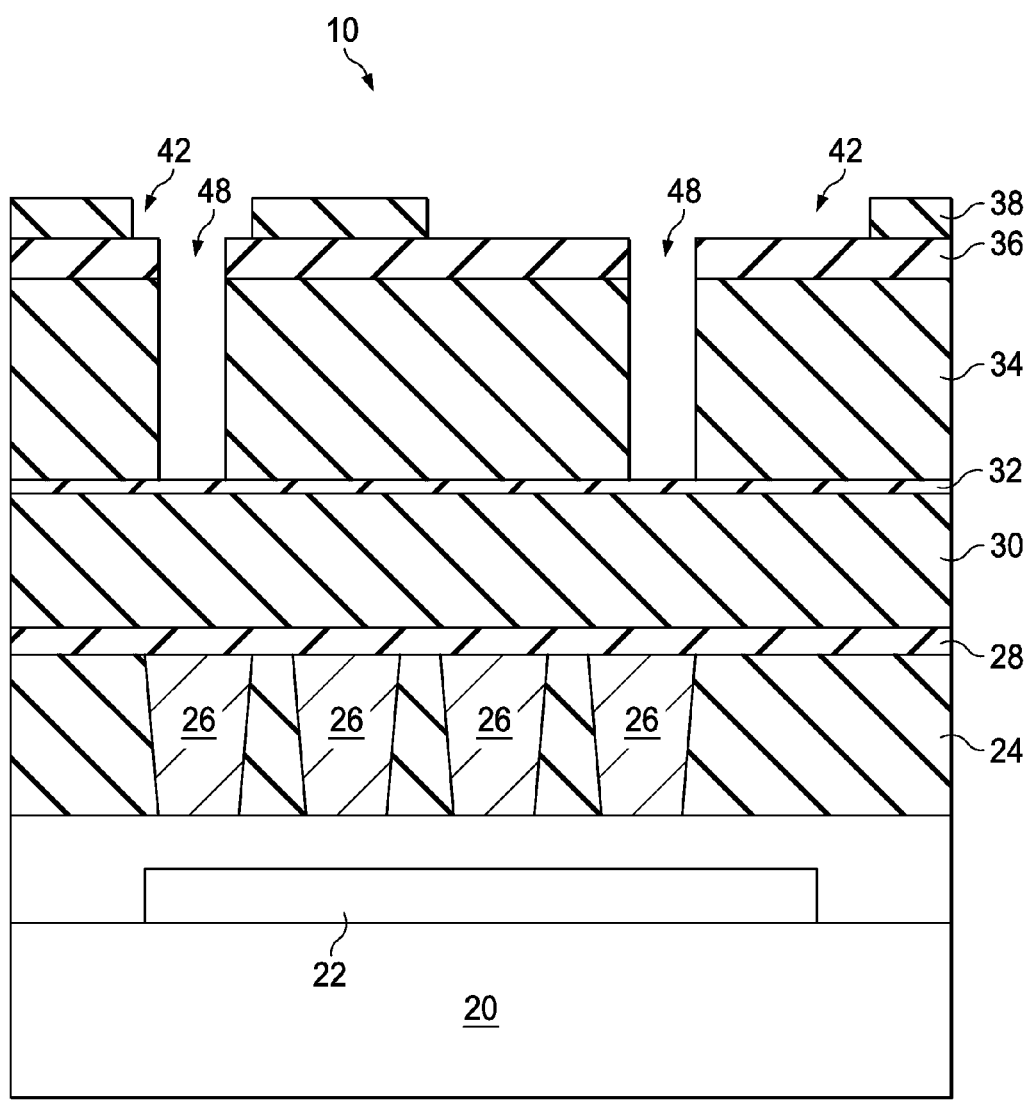

Photo resist 44 is used as an etching mask to etch low-k dielectric layer 34, so that openings 48 extend down into low-k dielectric layer 34, as shown in FIG. 5. In some exemplary embodiments, the etching is performed using dry etch. In the dry etch, an etchant gas comprising a fluorine-containing gas such as $CF_4$, $CH_2F_2$, $CHF_3$, $C_4F_8$, $C_4F_6$, or the like, may be used. Plasma is generated from the etchant gas. The etching stops on etch stop layer 32, and hence some portions of etch stop layer 32 are exposed through openings 48.

Figure 6:
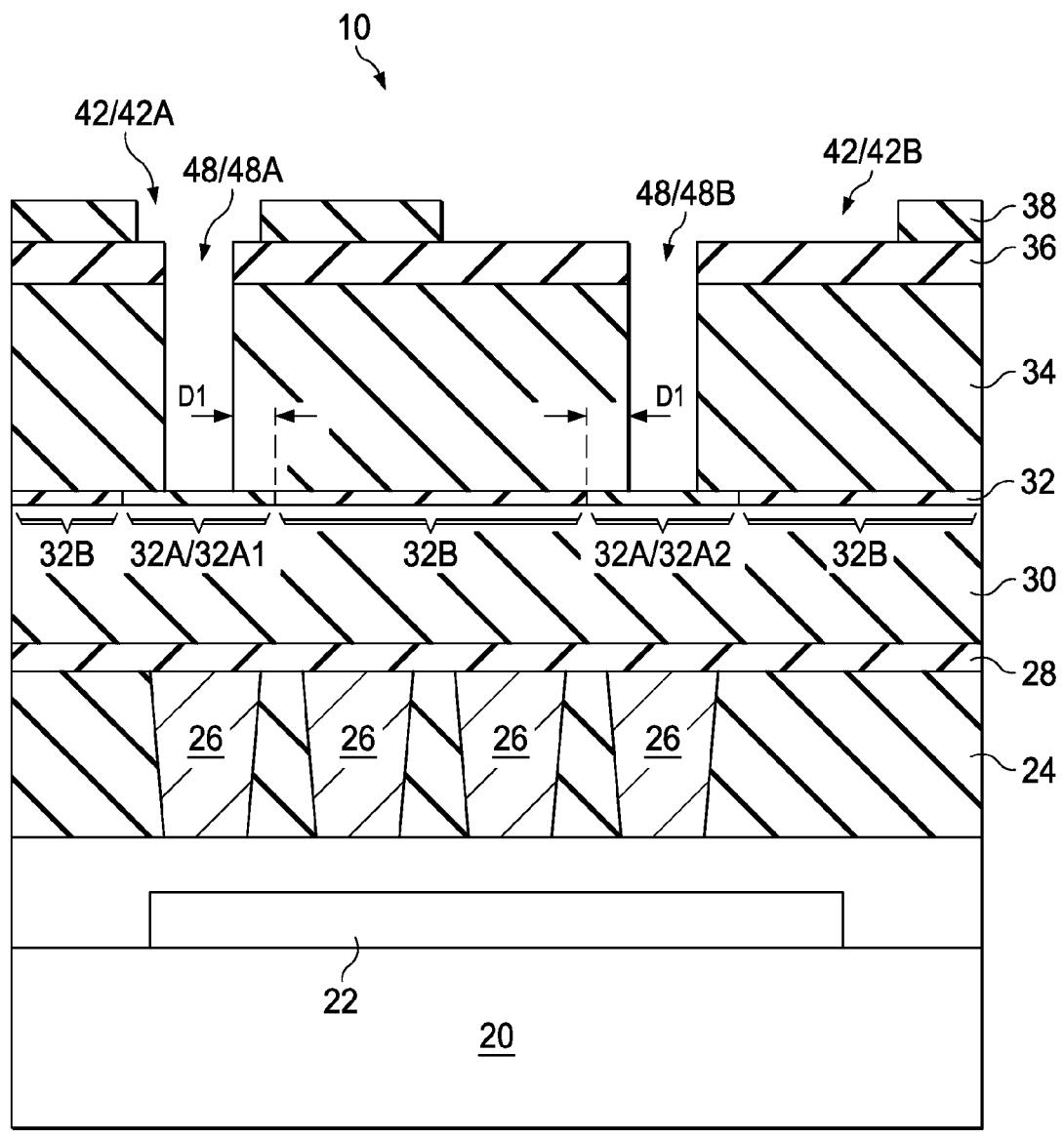

Next, referring to FIG. 6, a treatment is performed on etch stop layer 32 to convert the exposed portions of etch stop layer 32 and the adjacent surrounding portions into treated portions 32A, which have chemical compositions and characteristics different from the untreated portions 32B of etch stop layer 32. In the embodiments openings 48 have the same size and the same top-view shape, treated portions 32 have the same size and the same top-view shape.

The treatment causes the etching selectivity between treated portions 32A and the untreated portions 32B, which etching selectivity is observed in subsequent etching steps. In some exemplary embodiments, the treatment is performed through a wet treatment. In the treatment, materials may be removed from (or added into) portions 32A to cause the characteristic change in treated portions 32A. For example, the treatment may be performed using a fluorine-containing treatment solution (such as diluted HF), so that the metal in etch stop layer 32 react with the fluorine to form metal fluoride. The metal fluoride is dissolvable in water and hence is removed along with the treatment solution. Hence, the metal atoms/ions in etch stop layer 32 are partially removed, causing the reduction in the metal percentage in etch stop layer 32. The reaction may be expressed as:

$$MON + F^- \rightarrow MF \quad [Eq. 1]$$

Wherein M represents metal such as aluminum, manganese, cobalt, titanium, tantalum, tungsten, nickel, tin, magnesium, or combinations thereof, and "F-" represents the fluorine in the treatment solution. Chemical MF (which may be $AlF_3$, for example, when M is Al) is dissolved in water, and is removed along with the treatment solution.

The untreated portions 32B and treated portions 32A have different compositions, which means that at least one of the elements (such as the metal) have different atomic percentages in untreated portions 32B and treated portions 32A, or one of the elements is lacking in one of untreated portions 32B and treated portions 32A, but is presented in the other. Furthermore, untreated portions 32B and treated portions 32A may have some or all elements (such as O and/or N) in common. In some exemplary embodiments, the metal atomic percentage in untreated etch stop portions 32B is MAP1, and the metal atomic percentage in treated portions 32A is MAP2. Ratio MAP2/MAP1 may be smaller than about 0.7, for example, although ratio MAP2/MAP1 may be in a different range, depending on the process condition and the chemical used in the treatment.

As shown in FIG. 6, the treated portions 32A may have some parts unexposed through openings 48. The lateral size (such as length or diameter) D1 of the unexposed parts may be greater than about 1 nm, and may be between about 1 nm and 30 nm in some embodiments. In the top view of the structure in FIG. 6, the unexposed portions of the treated portions 32A forms a plurality of rings, each encircling the exposed portion of the same treated portion 32A.

Figure 7:
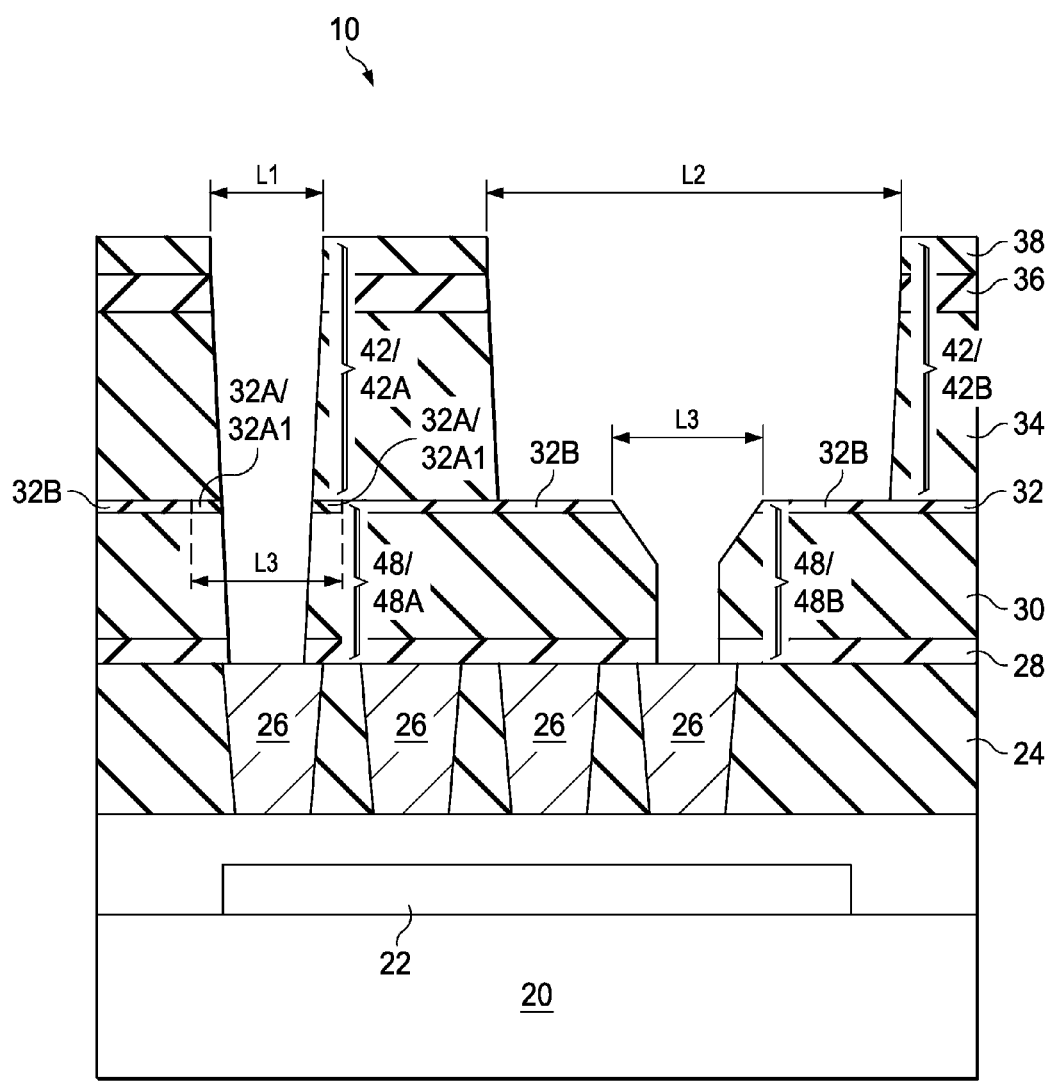

FIG. 7 illustrates an etching to extend trenches 42 (including 42A and 42B) and openings 48 (including 48A and 48B) downwardly. The etching may be an anisotropic etching, wherein an etchant gas such as $CF_4$, $CH_2F_2$, $CHF_3$, $C_4F_8$, $C_4F_6$, or combinations thereof, is used. Plasma is generated from the etchant gas. During the etching process, trenches 42 extend downwardly until the low-k dielectric layer 34 is etched through. Trenches 42 are overlying etch stop layer 32. In the meanwhile, openings 48 (FIG. 6) extend down until etch stop layer 28 is exposed. Another etchant may then be used to etch through etch stop layer 28, and hence the structure in FIG. 7 is formed.

During the etching process, hard mask 38 acts as an etching mask to define the patterns of trenches 42. The treated portions 32A are prone to the etching, and hence the exposed portions 32A are etched through. On the other hand, the un-treated portions 32B of etch stop layer 32 have a high resistance to the etching, and hence act as an etch stop layer. Alternatively stated, the etching selectivity, which is the etching rate of un-treated portions 32B to the etching rate of treated portions 32A, is high, and may be higher than about 10 or higher than about 30, for example.

Treated portions 32A have lateral sizes L3 greater than length L1 of trench 42A. Accordingly, treated portion 32A1 is etched partially, and has a portion remaining after the etching. The remaining portion forms a ring encircling via opening 48A. On the other hand, treated portions 32A have lateral sizes L3 smaller than length L2 of trench 42B. Accordingly, treated portion 32A2 (FIG. 6) are fully exposed when trench 42B extends down to the bottom of low-k dielectric layer 34. Since treated portion 32A2 is not resistant to the etchant using in the etching, it is removed. On the other hand, un-treated portions 32B remain un-etched (or at least not etched through). Hence, the shape and the size of via opening 48B are defined by the shape and the size of treated portion 32A2 (FIG. 6). In the embodiments of the present disclosure, the sizes of vias are defined by the sizes of the treated portions of etch stop layer 32, and is unrelated to the sizes of the overlying trenches. This differs from the conventional formation of trenches and via openings, in which the sizes of the vias are affected by the respective overlying trenches, and larger trenches results in larger vias.

Figure 8A:
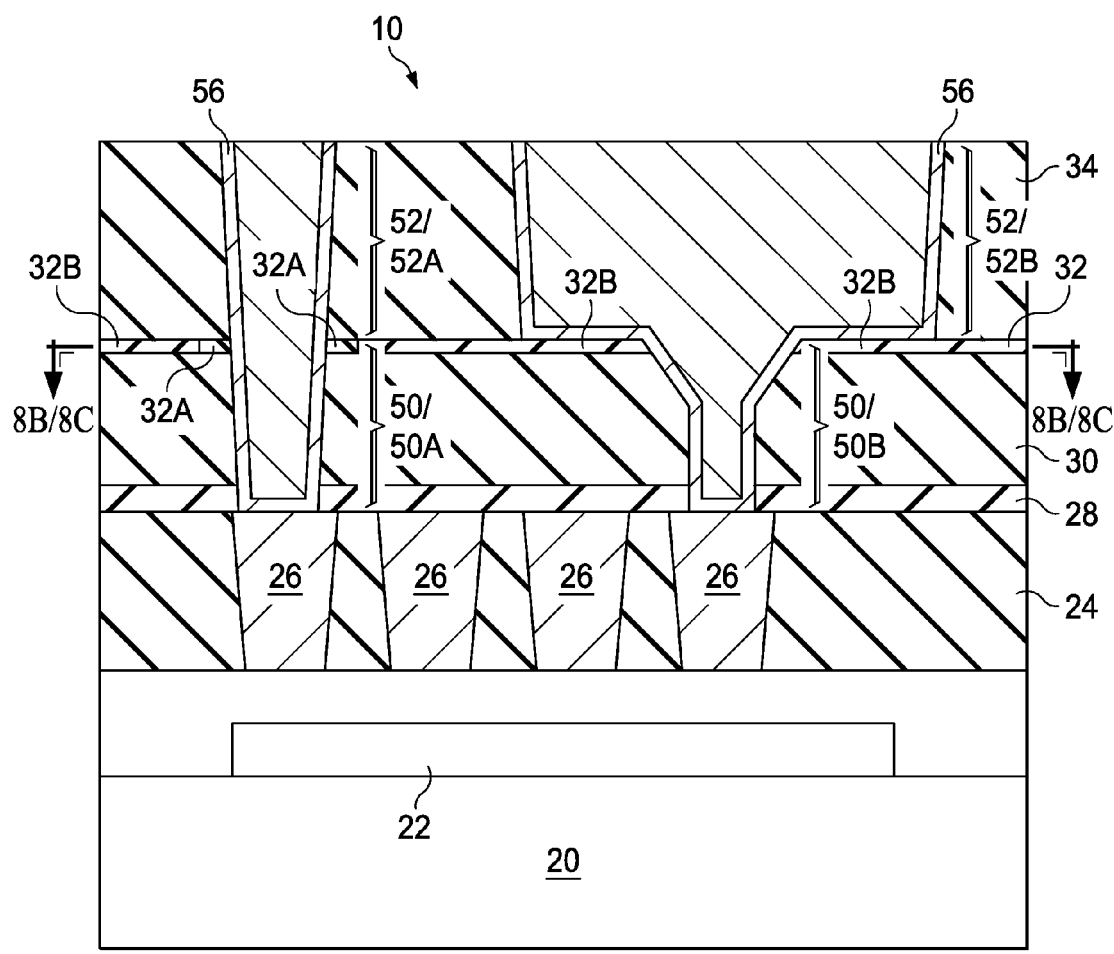

FIG. 8A illustrates the formation of vias 50 (including 50A and 50B) and metal lines 52 (including 52A and 52B). In some exemplary embodiments, a diffusion barrier layer 56 is formed to extend into via openings 48 and trenches 42 (FIG. 7), followed by the filling of remaining via openings 48 and trenches 42 with a metallic material such as copper or copper alloy. The excess diffusion barrier layer 56 and excess metallic material are then removed through Chemical Mechanical Polish (CMP), leaving vias 50 and metal lines 52, wherein each of vias 50 and metal lines 52 includes a portion of diffusion barrier layer 56 and the overlying portion of the metallic material. Hard masks 36 and 38 (FIG. 7) are removed. In some embodiments, hard masks 36 and/or 38 are used as a CMP stop layer, and are then removed in an etching step performed after the CMP. In alternative embodiments, hard masks 36 and/38 are removed by CMP.

FIGS. 8B and 8C illustrates the top views of vias 50, metal lines 52, and etch stop layer 32 in accordance with some exemplary embodiments. The top views are obtained from the horizontal plane crossing line 8B/8C in FIG. 8A. Metal lines 52 are illustrated using dashed lines. In FIGS. 8B and 8C, metal line 52A have top-view sizes and shapes (such as length L1 and width W1) similar to the top-view sizes and shapes of via 50A. Accordingly, treated portion 32A1 forms a ring encircling, and in physical contact with, the edges of via 50A. Furthermore, the width D1 of the ring of the treated portion 32A1 is substantially uniform in all directions.

In accordance with the embodiments of the present disclosure, when lateral sizes of metal lines 52 are greater than the respective lateral sizes of treated portions 32A, then no treated portions 32A will be left. Otherwise, treated portions 32A will be left adjacent to the respective vias. For example, in the embodiments in FIG. 8B, metal line 52B has width W1 smaller than width W2 of treated portion 32A2. Accordingly, treated portion 32A2 extends beyond metal line 52B in the Y-direction as shown in FIG. 8B, while in the lengthwise direction (the X-direction) of metal line 52B, all treated portion of dielectric layer 32 are removed in the step shown in FIG. 7. Alternatively stated, via 50B has the illustrated left and right edges contacting untreated portions 32B, and the illustrated top and bottom edges contacting treated portions 32A.

In alternative embodiments as shown in FIG. 8C, the length L2 and width W2 of metal line 52B are greater than the length and the width of treated portion 32A2 (refer to FIG. 6).

Accordingly, the treated portion 32A2 (FIG. 6) is removed entirely, and hence all edges of entire via 50B.

After the formation of vias 50 and metal lines 52, additional dielectric layers, metal lines, and vias (not shown) may be formed over the structure in FIG. 8. The overlying dielectric layers, metal lines, and vias may have structures similar to the structure of dielectric layer 28/30/32/34, metal lines 52, and vias 50.

Figure 9:
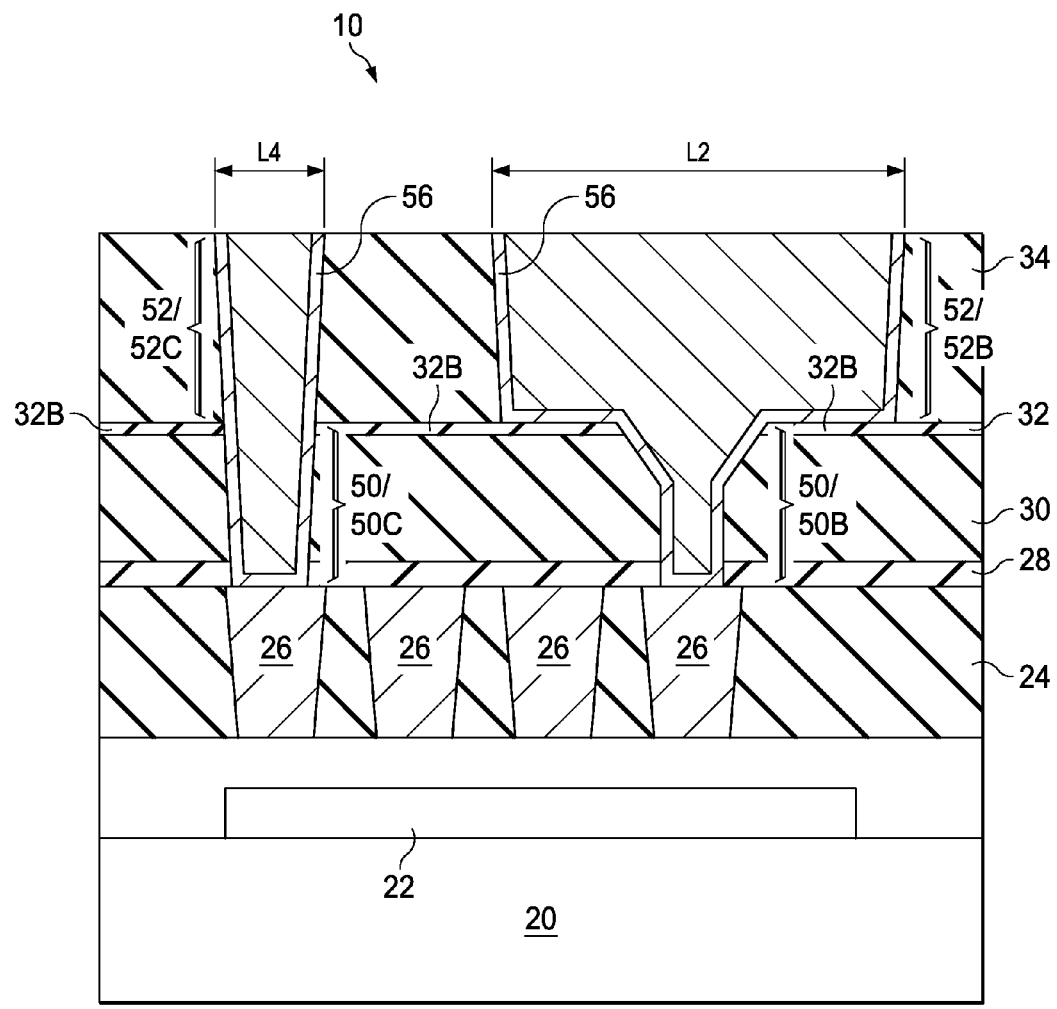

FIG. 9 illustrates via 50C and the overlying metal line 52C. Via 50C is formed simultaneously as the formation of vias 50A and 50B (FIG. 8A). Metal line 52C is formed simultaneously as the formation of metal lines 52A and 52B (FIG. 8A). Metal line 50C has length L4 smaller than length L2 of metal line 52B. On the other hand, length L4 is greater than the size of via 50C and the lateral size L3 (FIG. 7) of the treated portions 32A. Accordingly, although metal lines 52B and 52C have different sizes (with ratio L2/L3 being any value), vias 50B and 50C have substantially the same top-view sizes and same top-view shape.

The embodiments of the present disclosure have some advantageous features. By forming via openings and then treating etch stop layers through the via openings, the via openings have same sizes regardless of the sizes of the overlying metal lines. The adverse effect of leakage currents and breakdown caused by the non-uniform via sizes is thus at least reduced.

In accordance with some embodiments, an integrated circuit structure includes a first dielectric layer, an etch stop layer over the first dielectric layer, and a second dielectric layer over the etch stop layer. A via is disposed in the first dielectric layer and the etch stop layer. A metal line is disposed in the second dielectric layer, wherein the metal line is connected to the via. The etch stop layer includes a first portion having an edge contacting an edge of the via, wherein the first portion has a first chemical composition, and a second portion in contact with the first portion. The second portion is spaced apart from the via by the first portion, and wherein the second portion has a second chemical composition different from the first composition.

In accordance with other embodiments, an integrated circuit structure includes a first low-k dielectric layer, and a dielectric etch stop layer over the first low-k dielectric layer. The dielectric etch stop layer includes a first portion comprising a metal and an additional element, wherein the metal has a first atomic percentage in the first portion of the dielectric etch stop layer, and a second portion including the metal and the additional element. The metal has a second atomic percentage in the second portion of the dielectric layer, wherein the first atomic percent is lower than the second atomic percentage. A second low-k dielectric layer is over the dielectric etch stop layer. A via is in the first low-k dielectric layer and the dielectric etch stop layer, wherein the first portion of the dielectric etch stop layer forms a ring encircling and contacting the via. The second portion of the dielectric etch stop layer encircles the first portion. A metal line is in the second low-k dielectric layer and connected to the via.

In accordance with yet other embodiments, a method includes forming a first low-k dielectric layer, forming a dielectric etch stop layer over the first low-k dielectric layer, and forming a second low-k dielectric layer over the dielectric etch stop layer. A hard mask is formed over the second low-k dielectric layer. The hard mask is patterned to form a trench in the hard mask. The second low-k dielectric layer is etched to form a via opening, wherein the via opening is formed through the trench, and wherein a portion of the dielectric etch stop layer is exposed through the via opening. After the via opening is formed, a treatment is performed on the dielectric etch stop layer, wherein a first portion of the dielectric etch stop layer is treated to form a treated portion. An etching step is performed to form a trench in the second low-k dielectric layer, and a via in the dielectric etch stop layer and the first low-k dielectric layer. During the etching step, the treated portion has an etching rate higher than portions of the dielectric etch stop layer untreated in the treatment.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a first dielectric layer;
an etch stop layer over the first dielectric layer;
a second dielectric layer over the etch stop layer;
a first via in the first dielectric layer and the etch stop layer; and
a first metal line in the second dielectric layer, wherein the first metal line is connected to the first via, and wherein the etch stop layer comprises:
    a first portion having an edge contacting an edge of the via, wherein the first portion has a first chemical composition; and
    a second portion in contact with the first portion, wherein the second portion is spaced apart from the via by the first portion, and wherein the second portion has a second chemical composition different from the first chemical composition.

2. The integrated circuit structure of claim 1, wherein the first portion of the etch stop layer forms a ring encircling the via, with all edges of the via in contact with the first portion, and wherein the second portion of the etch stop layer encircles the first portion.

3. The integrated circuit structure of claim 1, wherein the first portion of the etch stop layer has a substantially uniform width.

4. The integrated circuit structure of claim 1, wherein the first portion and the second portion both comprise:
a metal; and
an additional element selected from oxygen, nitrogen, or combinations thereof.

5. The integrated circuit structure of claim 4, wherein the metal has a first atomic percentage in the first portion, the metal has a second atomic percentage in the second portion, and wherein the first atomic percentage is lower than the second atomic percentage.

6. The integrated circuit structure of claim 1 further comprising:
a second via in the first dielectric layer and the etch stop layer; and
a second metal line in the second dielectric layer, the second metal line being connected to the second via, wherein a top portion of the second via has a first lateral size substantially equal to a lateral size of the first portion of the etch stop layer, and wherein the second via is encircled by, and in contact with, a third portion of the etch stop layer, with the third portion of the etch stop layer having the second chemical composition.

7. The integrated circuit structure of claim 1, wherein the first portion and the second portion of the etch stop layer comprise a metal oxynitride, and wherein a first metal atomic percentage in the first portion of the etch stop layer is lower than a second metal atomic percentage in the second portion of the etch stop layer.

8. An integrated circuit structure comprising:
a first low-k dielectric layer;
a dielectric etch stop layer over the first low-k dielectric layer, wherein the dielectric etch stop layer comprises:
    a first portion comprising a metal and an additional element, wherein the metal has a first atomic percentage in the first portion of the dielectric etch stop layer; and
    a second portion comprising the metal and the additional element, wherein the metal has a second atomic percentage in the second portion of the first low-k dielectric layer, and wherein the first atomic percent is lower than the second atomic percentage;
a second low-k dielectric layer over the dielectric etch stop layer;
a first via in the first low-k dielectric layer and the dielectric etch stop layer, wherein the first portion of the dielectric etch stop layer forms a ring encircling and contacting the first via, with the second portion encircling the first portion; and
a first metal line in the second low-k dielectric layer and connected to the first via.

9. The integrated circuit structure of claim 8, wherein the ring has a uniform width in all lateral directions.

10. The integrated circuit structure of claim 8, wherein the first portion and the second portion of the dielectric etch stop layer comprise aluminum, and wherein the additional element is selected from the group consisting essentially of oxygen, nitrogen, or combinations thereof.

11. The integrated circuit structure of claim 8, wherein a ratio of the first atomic percentage to the second atomic percent is lower than about 0.7.

12. The integrated circuit structure of claim 8 further comprising:
a second via in the first low-k dielectric layer and the dielectric etch stop layer, wherein at least an edge of the second via is in contact with a third portion of the dielectric etch stop layer that comprises the metal, with the metal in the third portion having the second atomic percent; and
a second metal line in the second low-k dielectric layer and connected to the second via.

13. The integrated circuit structure of claim 12, wherein all portions of dielectric etch stop layer that are in contact with the second via comprise the metal that has the second atomic percentage.

14. The integrated circuit structure of claim 12, wherein an additional edge of the second via is in contact with a fourth portion of the dielectric etch stop layer that comprises the metal, with the metal in the fourth portion having the first atomic percent.

15. An integrated circuit structure comprising:
a first dielectric layer;
an etch stop layer over the first dielectric layer;
a second dielectric layer over the etch stop layer;
a metal line in the second dielectric layer; and
a via in the first dielectric layer and the etch stop layer, wherein the via comprises:
  a lower portion having first substantially straight edges; and
  a top portion having second substantially straight edges, wherein the second substantially straight edges connect the first substantially straight edges to a bottom surface of the metal line, and wherein the second substantially straight edges are more tilted than the second substantially straight edges, and the second substantially straight edges penetrate through the etch stop layer to extend into the first dielectric layer.

16. The integrated circuit structure of claim 15, wherein the etch stop layer comprises:
  a first portion having an edge contacting an edge of the via, wherein the first portion has a first chemical composition; and
  a second portion in contact with the first portion, wherein the second portion is spaced apart from the via by the first portion, and the second portion has a second chemical composition different from the first chemical composition.

17. The integrated circuit structure of claim 16, wherein the first portion and the second portion comprise a same metal, and the same metal has a first atomic percentage in the first portion, and a second atomic percentage in the second portion, and the first atomic percentage is lower than the second atomic percentage.

18. The integrated circuit structure of claim 16, wherein the first portion is not overlapped by the metal line.

19. The integrated circuit structure of claim 16, wherein the first portion comprises portions extending in a direction perpendicular to a lengthwise direction of the metal line.

* * * * *